(12) United States Patent
Su

(10) Patent No.: US 11,777,302 B2
(45) Date of Patent: Oct. 3, 2023

(54) LEAKAGE CURRENT BLOCKING CIRCUIT AND LEAKAGE CURRENT BLOCKING METHOD FOR DECOUPLING CAPACITOR

(71) Applicant: REALTEK SEMICONDUCTOR CORP., Hsinchu (TW)

(72) Inventor: Hung-Der Su, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 139 days.

(21) Appl. No.: 17/377,881

(22) Filed: Jul. 16, 2021

(65) Prior Publication Data

US 2022/0209523 A1 Jun. 30, 2022

(30) Foreign Application Priority Data

Dec. 31, 2020 (TW) ................................ 109147037

(51) Int. Cl.
*H02H 3/16* (2006.01)
*H01H 83/04* (2006.01)
*G01R 31/52* (2020.01)
*G01R 31/64* (2020.01)

(52) U.S. Cl.
CPC .............. *H02H 3/16* (2013.01); *G01R 31/52* (2020.01); *G01R 31/64* (2020.01); *H01H 83/04* (2013.01)

(58) Field of Classification Search
CPC .......... H02H 3/16; G01R 31/52; G01R 31/64; H01H 83/04

USPC ............................................................ 361/42
See application file for complete search history.

(56) References Cited

U.S. PATENT DOCUMENTS

| | | | | |
|---|---|---|---|---|
| 5,828,259 A | * | 10/1998 | Cases ................... | H01L 27/0248 327/377 |
| 8,669,828 B1 | * | 3/2014 | Wong ..................... | H01L 23/642 333/24 C |
| 9,692,424 B2 | * | 6/2017 | Kim .................. | H03K 19/00346 |
| 2008/0232019 A1 | * | 9/2008 | Todd .................... | H01L 27/0266 361/111 |
| 2017/0330874 A1 | * | 11/2017 | Robins ............... | H03K 19/0948 |

FOREIGN PATENT DOCUMENTS

TW I221920 B 10/2004

* cited by examiner

*Primary Examiner* — Thienvu V Tran
*Assistant Examiner* — Sreeya Sreevatsa
(74) *Attorney, Agent, or Firm* — Li & Cai Intellectual Property (USA) Office

(57) ABSTRACT

A leakage current blocking circuit and a leakage current blocking method for a decoupling capacitor are provided. A first end of the decoupling capacitor is coupled to a power voltage. The leakage current blocking circuit is coupled between a second end of the decoupling capacitor and a ground voltage, and the leakage current blocking circuit includes at least one switch. The at least one switch is used to provide a channel for the decoupling capacitor to be coupled to the ground voltage when the decoupling capacitor is not damaged, and when the decoupling capacitor is damaged, the at least one switch is turned off to block a leakage current of the decoupling capacitor.

8 Claims, 3 Drawing Sheets

LEAKAGE CURRENT BLOCKING CIRCUIT AND LEAKAGE CURRENT BLOCKING METHOD FOR DECOUPLING CAPACITOR

CROSS-REFERENCE TO RELATED PATENT APPLICATION

This application claims the benefit of priority to Taiwan Patent Application No. 109147037, filed on Dec. 31, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure is related to a leakage current blocking circuit and a leakage current blocking method, and more particularly to a leakage current blocking circuit and a leakage current blocking method for a decoupling capacitor.

BACKGROUND OF THE DISCLOSURE

A decoupling capacitor is generally a capacitor installed at a power end of an electronic component in a circuitry. A metal oxide semiconductor field effect transistor (MOSFET) is often used as a switch of the decoupling capacitor. However, an additional power loss may be increased if a leakage current is generated due to the decoupling capacitor being damaged.

Accordingly, how to provide a leakage current blocking circuit and a leakage current blocking method becomes an important issue in the art.

SUMMARY OF THE DISCLOSURE

In response to the above-referenced technical inadequacy, the present disclosure provides a leakage current blocking circuit for a decoupling capacitor. A first end of the decoupling capacitor is coupled to a power voltage.

The leakage current blocking circuit is coupled between a second end of the decoupling capacitor and a ground voltage. The leakage current blocking circuit includes at least one switch, which is used to provide a channel allowing the decoupling capacitor to be coupled to the ground voltage when the decoupling capacitor is not damaged.

On the contrary, if the decoupling capacitor is damaged, the at least one switch is turned off to block a leakage current of the decoupling capacitor.

In addition, a leakage current blocking method for the decoupling capacitor is also provided. A first end of the decoupling capacitor is coupled to a power voltage. In the leakage current blocking method, a leakage current blocking circuit is provided to be coupled between a second end of the decoupling capacitor and a ground voltage. When the decoupling capacitor is not damaged, at least one switch of the leakage current blocking circuit is used to provide a channel that allows the decoupling capacitor to be coupled to the ground voltage. On the contrary, when the decoupling capacitor is damaged, the at least one switch is turned off so as to block a leakage current of the decoupling capacitor.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
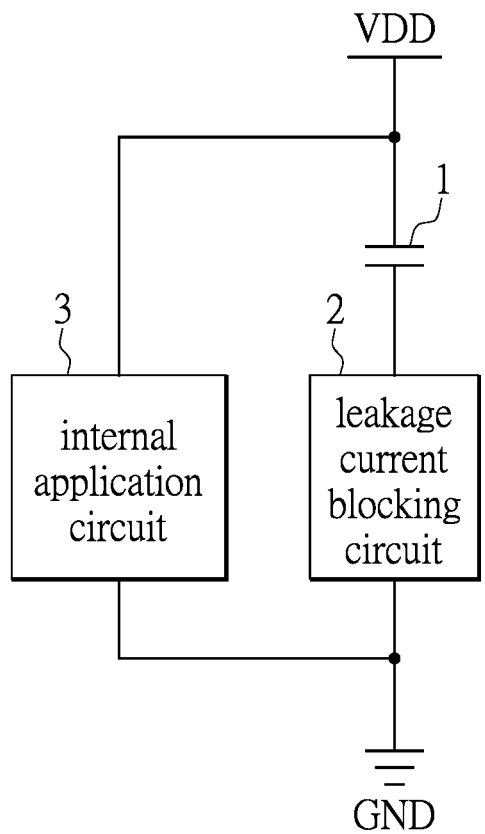
FIG. 1 is a functional block diagram depicting a leakage current blocking circuit according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a functional block diagram depicting a leakage current blocking circuit according to one embodiment of the present disclosure. As shown in FIG. 1, a first end of a decoupling capacitor 1 is coupled to a power voltage VDD. A leakage current blocking circuit 2 is coupled to in between a second end of the decoupling capacitor 1 and a ground voltage GND. Further, according to one aspect, an internal application circuit 3 can be provided to be coupled between the first end of the decoupling capacitor 1 and the ground voltage GND. It should be noted that the implementation of the internal application circuit 3 shown in FIG. 1 is not limited in the present disclosure, and the internal application circuit 3 may be modified by persons skilled in the art based on practical requirements or applications.

Still further, the present disclosure does not limit the practical implementation of the leakage current blocking circuit 2. In short, the leakage current blocking circuit 2 can include at least one switch (not shown in FIG. 1) that is used to provide a channel for the decoupling capacitor 1 to be coupled to the ground voltage GND when the decoupling capacitor 1 is not damaged. On the contrary, the at least one switch of the leakage current blocking circuit 2 is turned off to block a leakage current of the decoupling capacitor 1 when the decoupling capacitor 1 is damaged.

Figure 2:
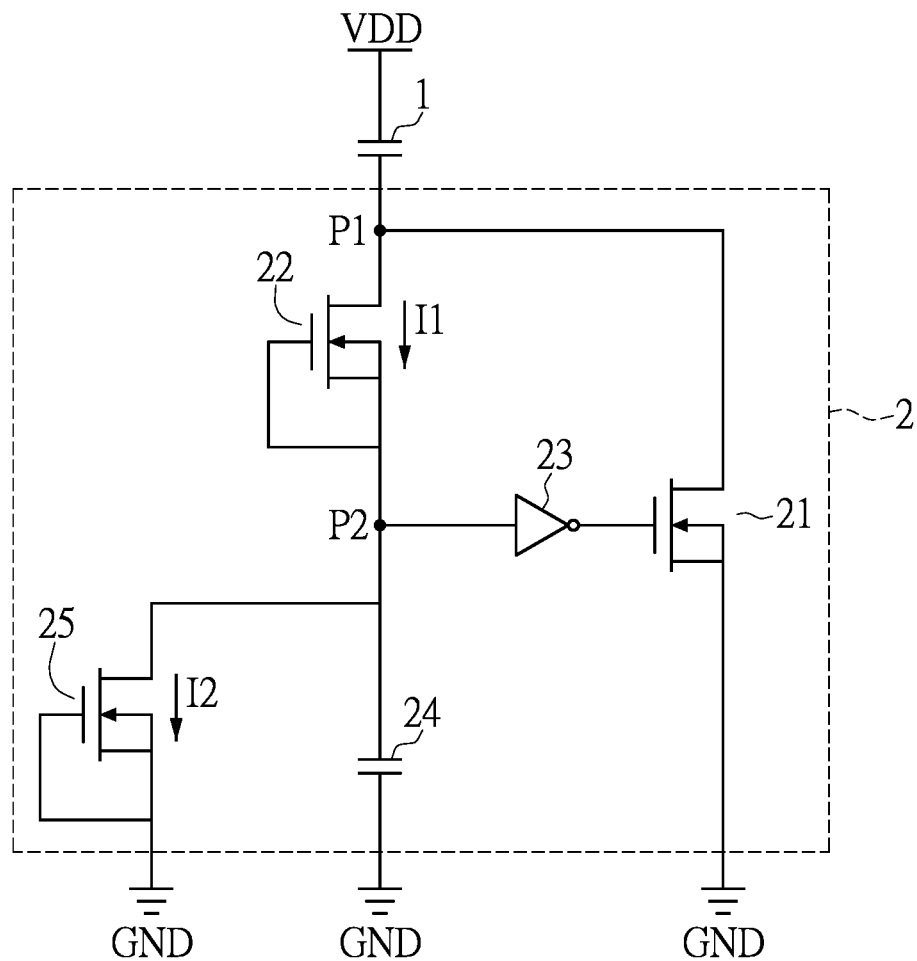
FIG. 2 is a schematic diagram of the leakage current blocking circuit of FIG. 1 according to one embodiment of the present disclosure.

For explaining how the at least one switch operates in detail, at least one embodiment of the leakage current blocking circuit 2 is described as follows. Reference is made to FIG. 2, which is a schematic diagram depicting the leakage current blocking circuit 2 of FIG. 1 in one embodiment of the present disclosure.

As shown in FIG. 2, the at least one switch can be implemented by a first N-type MOSFET 21. A drain of the first N-type MOSFET 21 is coupled to the second end of the decoupling capacitor 1. A source of the first N-type MOSFET 21 is coupled to the ground voltage GND. In other words, when the first N-type MOSFET 21 is operated at on state, a channel between the drain and the source of the first N-type MOSFET 21 is formed and allows the decoupling capacitor 1 to be coupled to the ground voltage GND. In an aspect of the disclosure, a gate voltage of the first N-type MOSFET 21 can be controlled in order to on or off the first N-type MOSFET 21.

For the purpose of automatically controlling the gate voltage of the first N-type MOSFET 21 when the decoupling capacitor 1 is not damaged, the first N-type MOSFET 21 is operated at on state allowing the decoupling capacitor 1 to be coupled to the ground voltage GND.

The leakage current blocking circuit 2 of FIG. 2 further includes a second N-channel depletion-mode MOSFET 22, an inverter 23, a capacitor 24, and a third N-channel depletion-mode MOSFET 25 according to one of the embodiments of the present disclosure. A drain of the second N-channel depletion-mode MOSFET 22 and the drain of the first N-type MOSFET 21 are commonly coupled to the second end of the decoupling capacitor 1 via a first node P1. A source of the second N-channel depletion-mode MOSFET 22 and a gate of the second N-channel depletion-mode MOSFET 22 are commonly coupled to a second node P2.

An input end of the inverter 23 is coupled to the second node P2, and an output end of the inverter 23 is coupled to a gate of the first N-type MOSFET 21. Further, a first end of the capacitor 24 is coupled to the second node P2, and a second end of the capacitor 24 is coupled to the ground voltage GND. A drain of the third N-channel depletion-mode MOSFET 25 and the first end of the capacitor 24 are commonly coupled to the second node P2. Further, a source of the third N-channel depletion-mode MOSFET 25 and a gate of the third N-channel depletion-mode MOSFET 25 are commonly coupled to the ground voltage GND.

Accordingly, under a situation that the decoupling capacitor 1 is not damaged, a first current I1 flowing through the second N-type MOSFET 22 is smaller than a second current I2 flowing through the third N-type MOSFET 25 since a direct current of the decoupling capacitor 1 is zero. In the meantime, the output end of the inverter 23 outputs a high-voltage signal since the input end of the inverter 23 inputs a low-voltage signal. The high-voltage signal at the output end of the inverter 23 is used to turn on the first N-type MOSFET 21 so as to allow the decoupling capacitor 1 to be coupled to the ground voltage GND via the drain of the first N-type MOSFET 21 and the source of the first N-type MOSFET 21. In other words, the decoupling capacitor 1 works normally at this time.

On the contrary, when the decoupling capacitor 1 is damaged, the first current I1 flowing through the second N-channel depletion-mode MOSFET 22 is greater than the second current I2 flowing through the third N-channel depletion-mode MOSFET 25. Meanwhile, the output end of the inverter 23 outputs a low-voltage signal since the input end of the inverter 23 inputs a high-voltage signal. The low-voltage signal at the output end of the inverter 23 is used to turn off the first N-type MOSFET 21 in order to block the leakage current of the decoupling capacitor 1. In other words, when the decoupling capacitor 1 is damaged, a path of the decoupling capacitor 1 connecting to the ground voltage GND is blocked by the first N-type MOSFET 21.

It should be noted that the implementation of the first N-type MOSFET 21, the second N-channel depletion-mode MOSFET 22, the inverter 23, the capacitor 24, and the third N-channel depletion-mode MOSFET 25 employed in the leakage current blocking circuit 2 presented in FIG. 1 are an exemplary example that is not used to limit the scope of the present disclosure.

Figure 3:
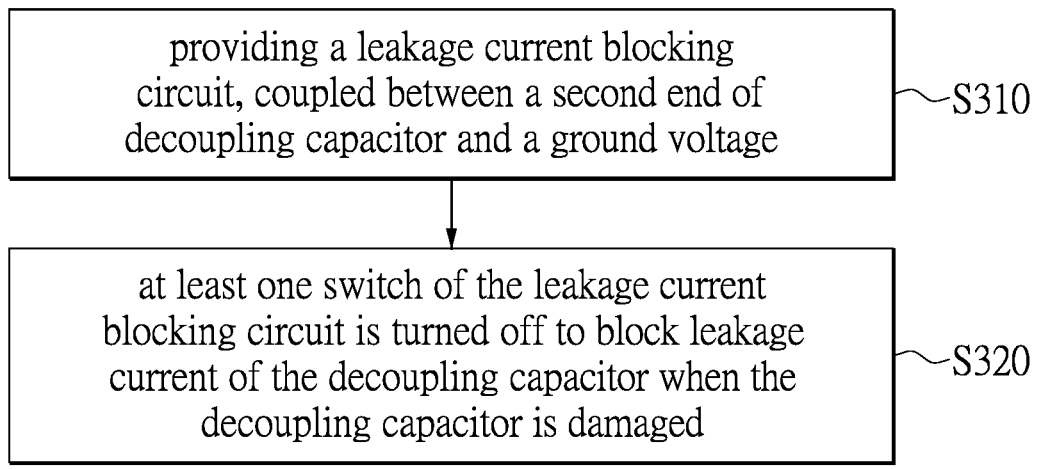
FIG. 3 is a flow chart describing a leakage current blocking method according to one embodiment of the present disclosure.

Reference is further made to FIG. 3, which is a flow chart describing a leakage current blocking method according to one embodiment of the present disclosure. In view of the functional block diagram shown in FIG. 1, in step S310 of FIG. 3, a leakage current blocking circuit 2 is provided. The leakage current blocking circuit 2 is coupled to a second end of a decoupling capacitor 1 and a ground voltage GND. When the decoupling capacitor 1 is not damaged, at least one switch of the leakage current blocking circuit 2 can be the first N-type MOSFET 21 as shown in FIG. 2 for providing a channel allowing the decoupling capacitor 1 to be coupled to the ground voltage GND. Otherwise, in step S320, when the decoupling capacitor 1 is damaged, the at least one switch of the leakage current blocking circuit 2 is turned off so as to block the leakage current of the decoupling capacitor 1. The related embodiments are described above and not reiterated in detail herein.

In summation, when the decoupling capacitor of a circuit is not damaged, the decoupling capacitor can be coupled to a ground voltage via at least one switch of a leakage current blocking circuit of the present disclosure. The switch can be implemented by an N-type MOSFET. On the contrary, when the decoupling capacitor is damaged, the path of the decoupling capacitor connecting to the ground voltage can be blocked by the at least one switch. In other words, the leakage current of the decoupling capacitor can be blocked by the least one switch. Accordingly, the leakage current blocking circuit and the leakage current blocking method of the present disclosure can effectively prevent shortening of life of an electronic component due to a temperature rise caused by the heat generated by the leakage current and avoid additional power loss.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A leakage current blocking circuit for a decoupling capacitor, wherein a first end of the decoupling capacitor is coupled to a power voltage, the leakage current blocking circuit is coupled between a second end of the decoupling capacitor and a ground voltage, and the leakage current blocking circuit comprises:
at least one switch used to provide a channel allowing the decoupling capacitor to be coupled to the ground voltage when the decoupling capacitor is not damaged; wherein the at least one switch is turned off to block a leakage current of the decoupling capacitor when the decoupling capacitor is damaged;
wherein the at least one switch is a first N-type MOSFET, a drain of the first N-type MOSFET is coupled to the second end of the decoupling capacitor, and a source of the first N-type MOSFET is coupled to the ground voltage;
wherein the leakage current blocking circuit further includes:
a second N-channel depletion-mode MOSFET, wherein a drain of the second N-channel depletion-mode MOSFET and the drain of the first N-type MOSFET are commonly coupled to the second end of the decoupling capacitor via a first node; and a source of the second N-channel depletion-mode MOSFET and a gate of the second N-channel depletion-mode MOSFET are commonly coupled to a second node; and
an inverter, wherein an input end of the inverter is coupled to the second node, and an output end of the inverter is coupled to a gate of the first N-type MOSFET.

2. The leakage current blocking circuit according to claim 1, further comprising:
a capacitor, wherein a first end of the capacitor is coupled to the second node, and a second end of the capacitor is coupled to the ground voltage; and
a third N-channel depletion-mode MOSFET, wherein a drain of the third N-channel depletion-mode MOSFET and the first end of the capacitor are commonly coupled to the second node, and a source of the third N-channel depletion-mode MOSFET and a gate of the third N-channel depletion-mode MOSFET are commonly coupled to the ground voltage.

3. The leakage current blocking circuit according to claim 2, wherein, when the decoupling capacitor is not damaged, a first current flowing through the second N-channel depletion-mode MOSFET is smaller than a second current flowing through the third N-channel depletion-mode MOSFET, the output end of the inverter outputs a high-voltage signal since the input end of the inverter inputs a low-voltage signal, and the high-voltage signal is used to turn on the first N-type MOSFET for allowing the decoupling capacitor to be coupled to the ground voltage via the drain of the first N-type MOSFET and the source of the first N-type MOSFET.

4. The leakage current blocking circuit according to claim 2, wherein, when the decoupling capacitor is damaged, a first current flowing through the second N-channel depletion-mode MOSFET is greater than a second current flowing through the third N-channel depletion-mode MOSFET, the output end of the inverter outputs a low-voltage signal since the input end of the inverter inputs a high-voltage signal, and the low-voltage signal is used to turn off the first N-type MOSFET to block the leakage current of the decoupling capacitor.

5. A leakage current blocking method for a decoupling capacitor, wherein a first end of the decoupling capacitor is coupled to a power voltage, and the leakage current blocking method comprises:
providing a leakage current blocking circuit coupled between a second end of the decoupling capacitor and a ground voltage, wherein, at least one switch of the leakage current blocking circuit is used to provide a channel allowing the decoupling capacitor to be coupled to the ground voltage when the decoupling capacitor is not damaged; and
the at least one switch of the leakage current blocking circuit being turned off so as to block a leakage current of the decoupling capacitor when the decoupling capacitor is damaged;
wherein the at least one switch is a first N-type MOSFET, a drain of the first N-type MOSFET is coupled to the second end of the decoupling capacitor, and a source of the first N-type MOSFET is coupled to the ground voltage;
wherein the leakage current blocking circuit further includes:
a second N-channel depletion-mode MOSFET, wherein a drain of the second N-channel depletion-mode MOSFET and the drain of the first N-type MOSFET are commonly coupled to the second end of the decoupling capacitor via a first node; and a source of the second N-channel depletion-mode MOSFET and a gate of the second N-channel depletion-mode MOSFET are commonly coupled to a second node; and
an inverter, wherein an input end of the inverter is coupled to the second node, and an output end of the inverter is coupled to a gate of the first N-type MOSFET.

6. The leakage current blocking method according to claim 5, wherein the leakage current blocking circuit further comprises:
a capacitor, wherein a first end of the capacitor is coupled to the second node, and a second end of the capacitor is coupled to the ground voltage; and
a third N-channel depletion-mode MOSFET, wherein a drain of the third N-channel depletion-mode MOSFET and the first end of the capacitor are commonly coupled to the second node, and a source of the second N-channel depletion-mode MOSFET and a gate of the second N-channel depletion-mode MOSFET are commonly coupled to the inverter input node.

7. The leakage current blocking method according to claim 6, wherein, when the decoupling capacitor is not damaged, a first current flowing through the second N-channel depletion-mode MOSFET is smaller than a second current flowing through the third N-channel depletion-mode MOSFET, the output end of the inverter outputs a high-voltage signal since the input end of the inverter inputs a low-voltage signal, and the high-voltage signal is used to turn on the first N-type MOSFET for allowing the decoupling capacitor to be coupled to the ground voltage via the drain of the first N-type MOSFET and the source of the first N-type MOSFET.

8. The leakage current blocking method according to claim 6, wherein, when the decoupling capacitor is damaged, a first current flowing through the second N-channel depletion-mode MOSFET is greater than a second current flowing through the third N-channel depletion-mode MOSFET, the output end of the inverter outputs a low-voltage signal since the input end of the inverter inputs a high-voltage signal, and the low-voltage signal is used to turn off the first N-type MOSFET to block the leakage current of the decoupling capacitor.

* * * * *